(12) United States Patent
Schmidt et al.

(10) Patent No.: US 6,498,359 B2
(45) Date of Patent: Dec. 24, 2002

(54) FIELD-EFFECT TRANSISTOR BASED ON EMBEDDED CLUSTER STRUCTURES AND PROCESS FOR ITS PRODUCTION

(75) Inventors: Oliver G. Schmidt, Stuttgart (DE); Karl Eberl, Weil der Stadt (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 0 days.

(21) Appl. No.: 09/860,742

(22) Filed: May 18, 2001

(65) Prior Publication Data

US 2001/0045582 A1 Nov. 29, 2001

(30) Foreign Application Priority Data

May 22, 2000 (DE) .......................... 100 25 264

(51) Int. Cl.[7] ................. H01L 31/0328; H01L 29/161
(52) U.S. Cl. ............... 257/190; 257/192; 257/404; 257/616
(58) Field of Search .................. 257/24, 190, 192, 257/404, 609, 616, 617

(56) References Cited

U.S. PATENT DOCUMENTS

| | | | | |
|---|---|---|---|---|
| 4,710,788 A | * | 12/1987 | Dambkes et al. ............. | 257/194 |
| 4,814,838 A | * | 3/1989 | Kuroda et al. ............... | 257/190 |
| 4,827,320 A | * | 5/1989 | Morkoc et al. ............... | 257/18 |
| 4,865,659 A | * | 9/1989 | Shigeta et al. ............... | 148/33.4 |
| 4,994,866 A | * | 2/1991 | Awano .......................... | 257/190 |
| 5,057,880 A | * | 10/1991 | Eshita et al. ................. | 257/18 |
| 5,075,742 A | * | 12/1991 | Gerard et al. ................. | 257/96 |
| 5,241,214 A | * | 8/1993 | Herbots et al. .............. | 257/649 |
| 5,245,208 A | * | 9/1993 | Eimori .......................... | 257/344 |
| 5,331,185 A | * | 7/1994 | Kuwata ......................... | 257/192 |
| 5,357,119 A | * | 10/1994 | Wang et al. ................... | 257/18 |
| 5,461,243 A | * | 10/1995 | Ek et al. ....................... | 257/190 |
| 5,461,250 A | * | 10/1995 | Burghartz et al. ........... | 257/347 |
| 5,561,302 A | * | 10/1996 | Candelaria ................... | 257/24 |
| 6,424,004 B2 | * | 7/2002 | Kim et al. ..................... | 257/321 |

FOREIGN PATENT DOCUMENTS

| | | | |
|---|---|---|---|
| EP | 0 437 385 | 7/1991 | |
| EP | 0 921 575 | 6/1999 | |
| JP | 4-03-227530 | * 10/1991 | ............. 257/192 |
| JP | 4-05-129635 | * 5/1993 | ............. 257/19 |

OTHER PUBLICATIONS

Murakami et al., Ultra High Hole Mobility in Strain–Controlled Si–Ge Modulation–Doped FET, 1990, IEEE, IEDM, pp. 375–378.*

Wang et al., High Hole Mobility Transistor (HHMT) With Dual Si/Ge0.4Si0.6/Si Wells Structure Grown by Si MBE, IEEE, EDMS '94, pp. 2–5–17 to 2–5–20.*

J. Welser et al., "Electronic Mobility Enhancement in Strained–Si N–Type Metal–oxide–Semiconductor Field–Effect Transistors." IEEE Electron Device Letters, vol. 15, No. 3, Mar. 1994, pp 100–102.

* cited by examiner

Primary Examiner—George C. Eckert, II
(74) Attorney, Agent, or Firm—Christie, Parker & Hale, LLP

(57) ABSTRACT

In field-effect transistors, semiconductor clusters, which can extend from the source region to the drain region and which can be implemented in two ways, are embedded in one or a plurality of layers. In a first embodiment, the semiconductor material of the adjacent channel region can be strained by the clusters and the effective mass can thus be reduced by altering the energy band structure and the charge carrier mobility can be increased. In a second embodiment, the clusters themselves can be used as a canal region. These two embodiments can also appear in mixed forms. The invention can be applied to the Si material system with SiGe clusters or to the GaAs material system with InGaAs clusters or to other material systems.

26 Claims, 5 Drawing Sheets

Figure 1A:
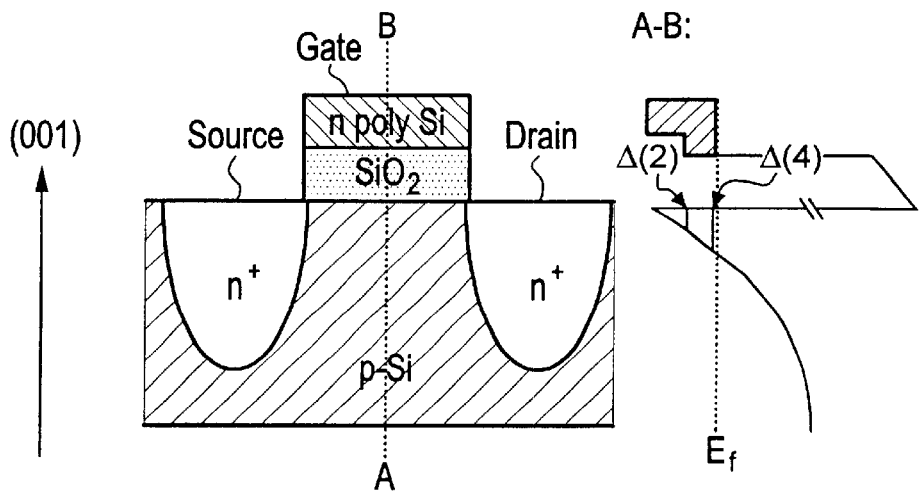

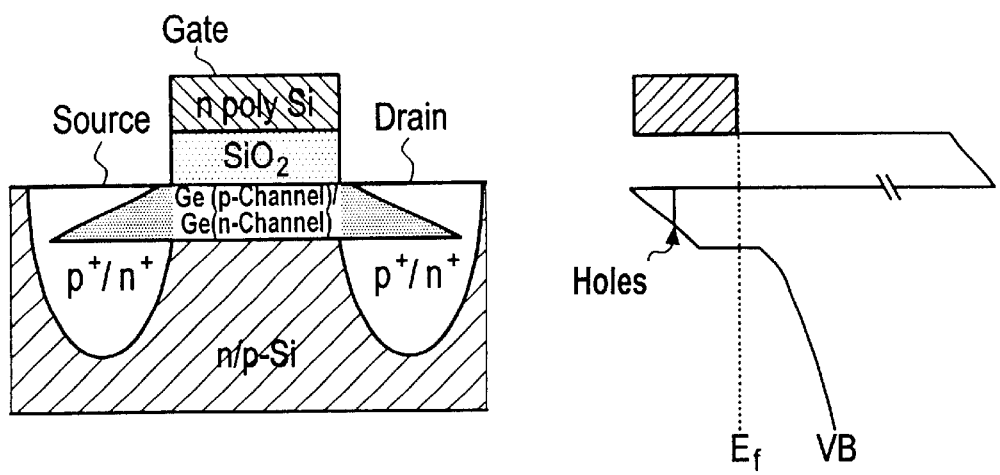
Fig.3a
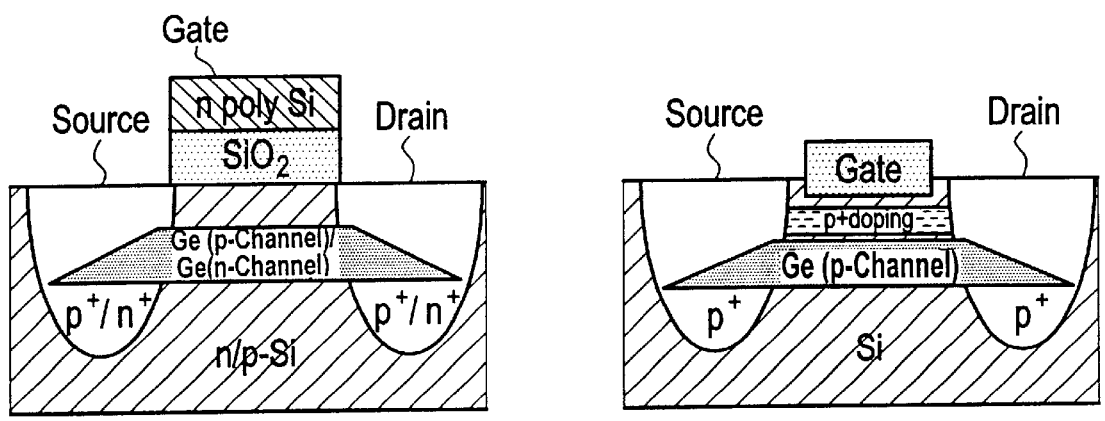
Fig.3b
Fig.4a
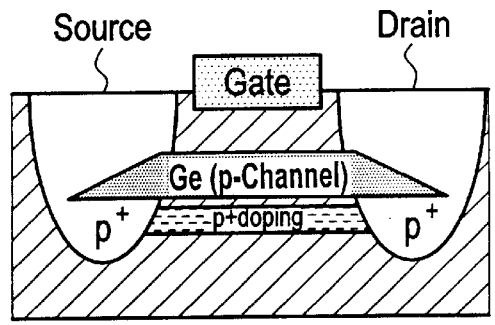
Fig.4b
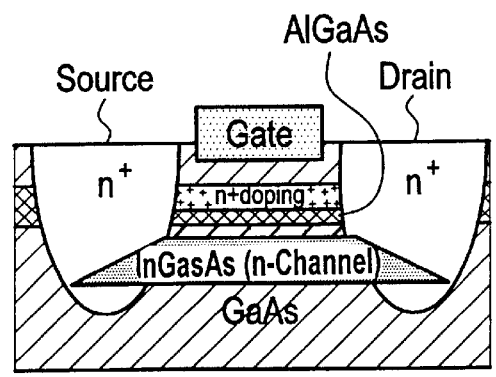
Fig.5

FIELD-EFFECT TRANSISTOR BASED ON EMBEDDED CLUSTER STRUCTURES AND PROCESS FOR ITS PRODUCTION

CROSS-REFERENCE TO RELATED APPLICATION

This application claims priority of German patent application number 100 25 264.8, filed May 22, 2000.

The present invention concerns a field-effect transistor based on embedded cluster or island structures made of semiconductor material and a process for its production. The invention refers both to those field-effect transistors in which the strain caused by cluster structures is used in an immediately adjacent channel region and to those field-effect transistors in which the channel region itself is formed by the cluster structures.

Already, field-effect transistors are known in which the channel region is formed from strained semiconductor material. In the publication "Electronic Mobility Enhancement in Strained-Si N-Type Metal-Oxide-Semiconductor Field-Effect Transistors" by J. Welser et al., a field-effect transistor is described in which a pseudomorphically strained Si-channel region is produced by growing a Si layer on a relaxed SiGe buffer layer. The expansion strain in the Si material of the channel region results in a change in the band structure and in a cancellation of the six-fold band degeneracy, whereby higher electron and hole nobilities may be obtained.

The disadvantages of this type of strained field-effect transistors consist, however, in that the relaxed SiGe buffer layer is a few microns thick and is thus expensive and time-consuming to produce. Moreover, these layers have a high concentration of crystal defects which are an impairment to the large-area integration of transistors.

EP 0,921,575 describes a heterostructure MIS field-effect transistor with an expansion strained channel layer whereby a first Si layer, a carbon-containing $Si_{2-Y}C_Y$ layer which serves as a canal region, and an optional second Si layer are deposited in this order on a substrate. The carbon content Y and the thickness of the $Si_{2-Y}C_Y$ layer are selected such that the carbon-containing Si material has an expansion strain and this results, in the same manner as in pure expansion-strained silicon, in a splitting of the conduction and valence bands, reduced effective masses, and an increase in the mobility of charge carriers. Expansion-strained field-effect transistors of this type are, obviously, simpler to produce, since no thick SiGe buffer layers have to be grown. The disadvantage of these transistors lies, however, in that their most important region, i.e., the channel region, is no longer formed from pure silicon, but from carbon-containing silicon, whereby the component characteristics are extremely dependent upon the carbon content and the thickness of the channel layer. Thus, it is difficult to produce these field-effect transistors with reproducible component characteristics.

The object of the present invention is to report a fundamentally new material structure for a field-effect transistor, especially for its channel region, by means of which the performance characteristics of the transistor can be improved. A further object of the invention is to report a process for its production.

A field-effect transistor according to the invention, also referred to as a DOTFET, is essentially based on the use of clusterlike or islandlike semiconductor material structures in the channel region or in the vicinity of the channel region of the field-effect transistor. The clusters may be used in two fundamentally different embodiments. According to a first embodiment, they can be arranged below the actual channel region and generate a strain field in the semiconductor material of the channel region, whereby the band structure of the semiconductor material is suitably altered. The band structure may be altered with suitable material selection such that the effective masses of the charge carriers can be reduced and their mobility can be increased. In this variant, the clusterlike structures are, however, not themselves a part of the channel region of the transistor. According to a second embodiment, the channel region itself may also be formed by the clusters or islands. Mixed forms between these two embodiments are also conceivable, wherein the source/drain current flows both through the clusters and through semiconductor layers strained by the clusters.

The field-effect transistor also has source and drain regions which run vertically at least to the channel region. In the above-described first embodiment, wherein the channel region is formed by an expansion-strained semiconductor layer formed above a cluster layer, it is advantageous that relatively flat source/drain regions are formed. However, if, according to the first embodiment a plurality of the embedded expansion-strained silicon channel regions are to be generated and used, the source/drain regions should be formed to a greater depth, possibly down to the lowest semiconductor channel layer. If the channel region according to the second embodiment is to be formed by the clusters themselves, it may be necessary that the source/drain regions be formed to at least the one cluster layer or with the use of a plurality of cluster layers to a greater depth, possibly down to the lowest cluster layer. However, this is not absolutely obligatory even with the second embodiment since the channel region can be formed uniformly from the clusters of the second semiconductor material and the surrounding first semiconductor material located above it, whereby it is then adequate if the source/drain regions only extend to the semiconductor layer located above them. Above this, the embedded island structures of the second semiconductor material can form potential cavity structures within the first semiconductor material because of a lower band gap.

An essential characteristic of the field-effect transistor according to the invention consists in that at least part of the clusters run laterally between two sections which lie either, according to the first embodiment, directly under the source/drain regions, or, according to the second embodiment, inside the source/drain regions. In the first embodiment, it is, consequently, ensured that the semiconductor channel region expansion-strained by such clusters is formed between the source and drain regions. In the second embodiment, it is guaranteed that the channel region formed by the clusters themselves is formed between the source and drain regions.

In the production of field-effect transistors according to the invention, use is made of the phenomenon that with lattice-mismatched growth of a semiconductor material on a substrate of another semiconductor material with suitable selection of material, self-organized growth of island structures on the substrate occurs according to the Stranski-Krastanov mechanism. The layer, which is applied flat, breaks down spontaneously into a three-dimensional system of clusters because the elastic energy stored in the entire system is reduced thereby and an optimum compromise between different energies partially canceling each other occurs. In EP 0,437,385 A, for example, the growth of InAs growth islands on a GaAs substrate is described. Because of the lattice mismatch, a thin InAs wetting layer initially forms, above which a further growth of InAs results in the spontaneous formation of microscopic island structures. Under certain growth conditions, the exact same behavior is observed in the growth of germanium-rich SiGe on silicon substrates. For the present invention, use is made of the fact that the islands on the surface partially relax elastically. When the semiconductor material of the substrate is again grown on such growth islands, i.e., for example, silicon material on SiGe islands, a strain field is generated in this material. Since SiGe has a higher lattice constant than Si, the silicon material exhibits an expansion strain above the SiGe islands. Such an expansion-strained silicon layer can thus be generated by growth on SiGe islands, without having to produce a multi-micron-thick, relaxed, high-dislocation SiGe layer.

For a production process of field-effect transistors according to the invention, in particular in relatively high numbers and regular arrangement, it is thus advantageous if the growth of the islands proceeds not completely self-organized but, instead, is oriented by suitable specimen preparation. In a preferred method of producing a field-effect transistor, the clusters are, for example, deliberately produced spatially on prestructured substrates such that the aforementioned conditions can be fulfilled in the subsequent production of source and drain regions deliberately for a large number off transistors. In a process according to the invention, a semiconductor substrate is prepared from a first semiconductor material, or, in a layer formed from the semiconductor substrate, at least one linear depression is formed in the surface of the semiconductor substrate, whose width is less than or equal to the gate lengths of the field-effect transistor to be reduced; alternating layers of the first semiconductor material and a second semiconductor material different from the first are repeatedly grown, until the surface is substantially planarized; and, finally, a cluster layer of the second semiconductor material is grown. Already, at the time the first growth of a layer of the second semiconductor material, in the case of SiGe, there occurs, for energy reasons, a certain material accumulation of Ge in the recessed sections and thus a strain field is generated in a Si layer deposited thereon in these regions.

In this manner, by suitable substrate preparation, it is possible to cause clusters to be generated substantially along a line such that during a subsequent process step, the source and drain regions must be formed on both sides of this line.

The field-effect transistor according to the invention can be realized in various semiconductor material systems. A first implementation possibility concerns the silicon/germanium material system. A field-effect transistor made of this material system thus includes a semiconductor substrate made of silicon and a cluster layer in which a plurality of semiconductor clusters made of $Si_xGe_{1-x}$ ($0 \leq X < 1$) are arranged on the substrate and are embedded in silicon material.

In the following, the present invention is illustrated in detail with reference to the drawings wherein, among other things, a few of the exemplary embodiments are depicted schematically.

Figure 1B:
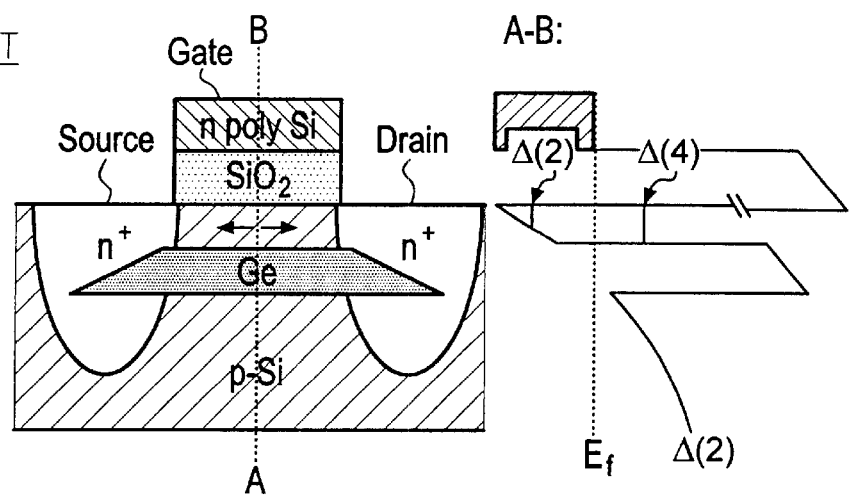
Figure 1C:
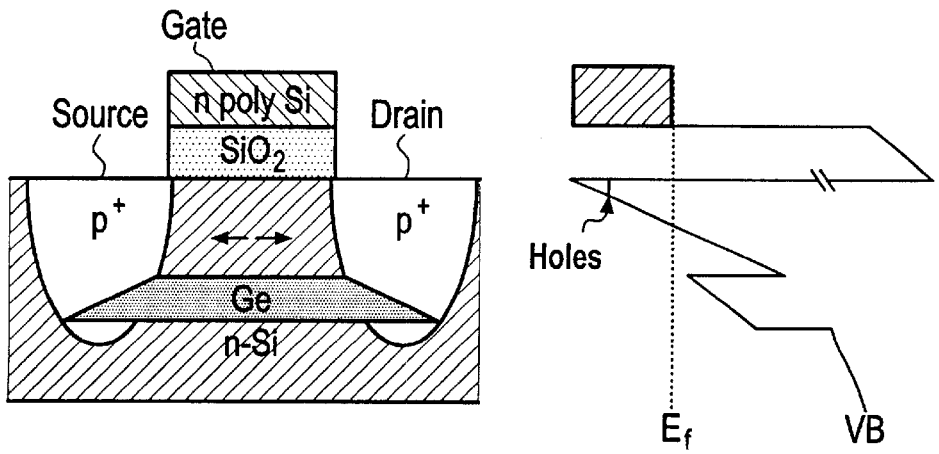
Figure 1D:
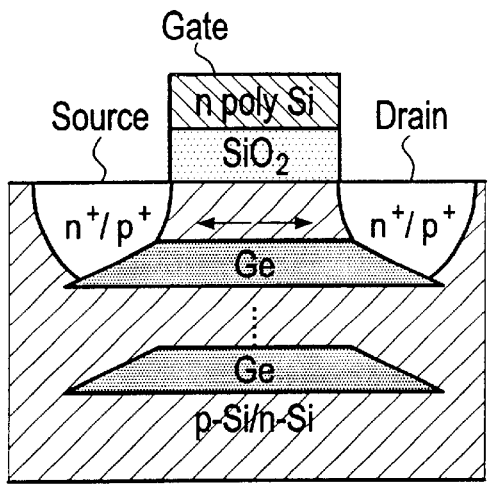
Figure 2A:
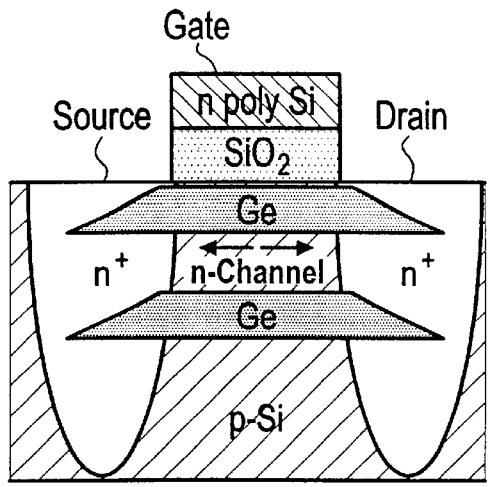
Figure 2B:
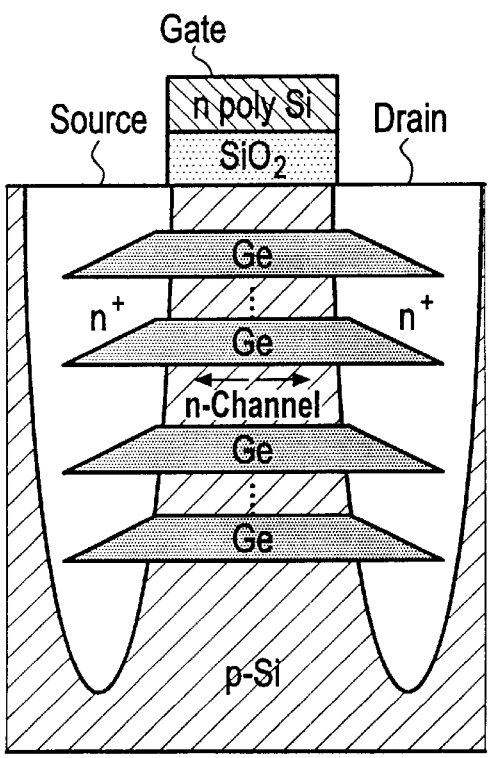
Figure 6:
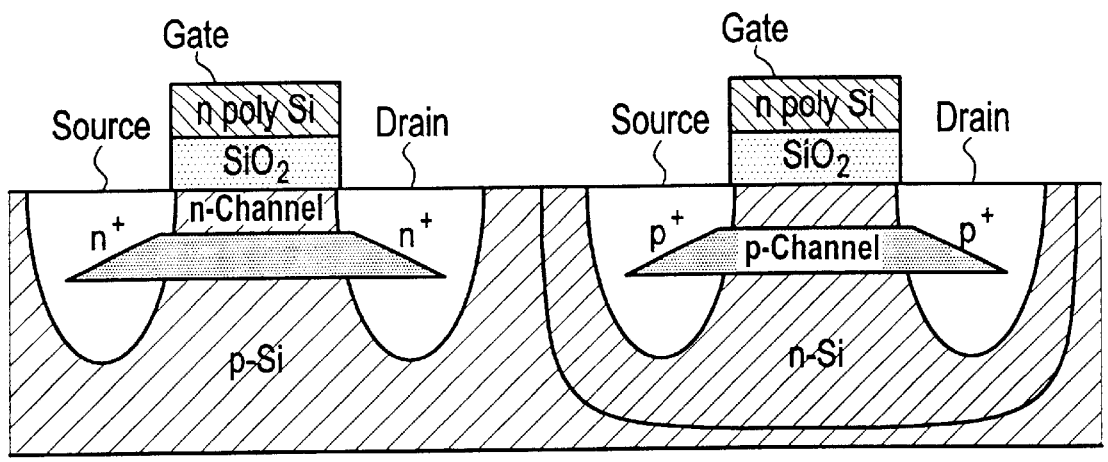
Figure 7:
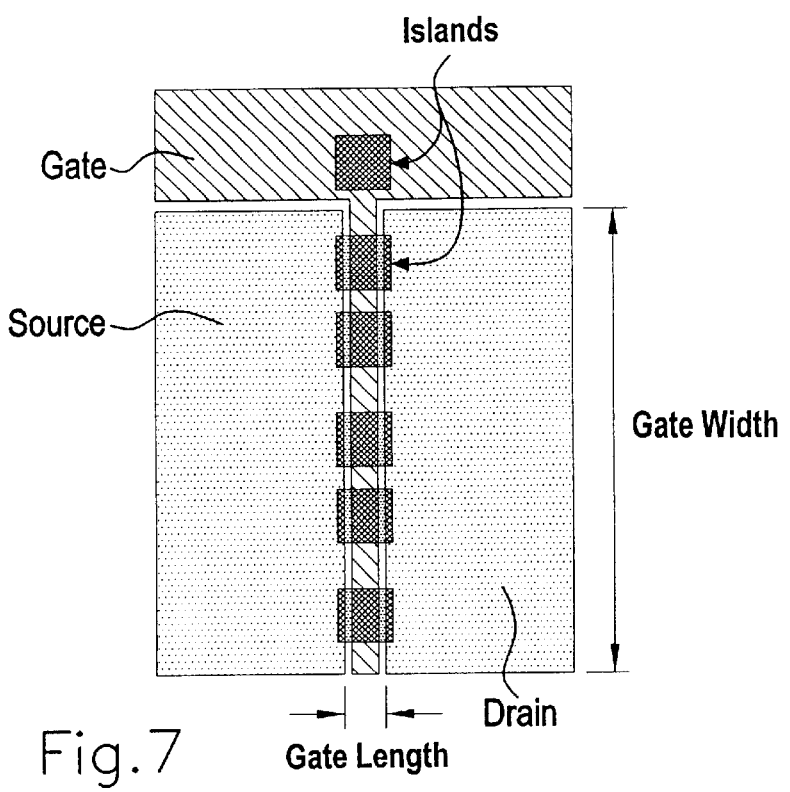
Figure 8:
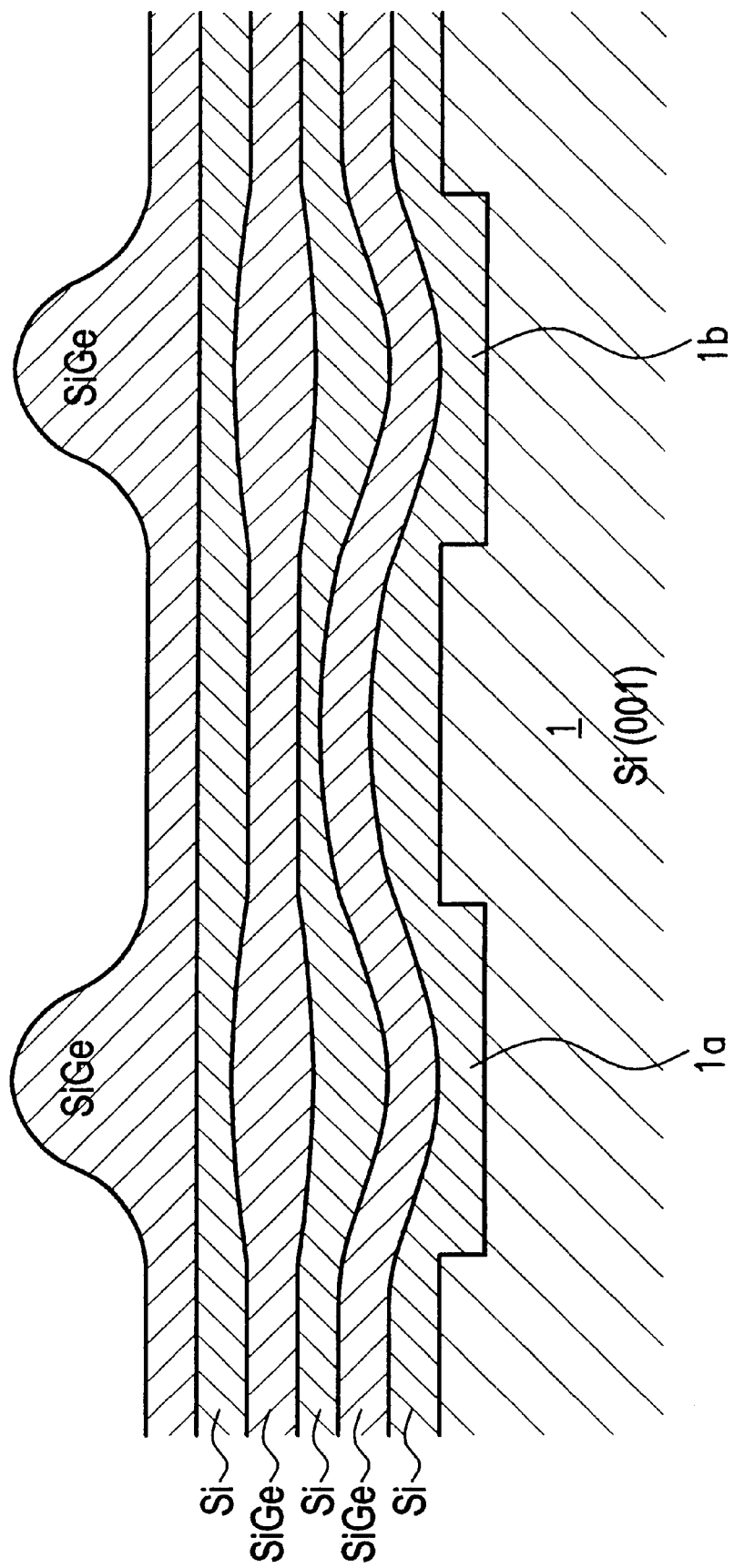

They depict:

FIGS. 1a, b a conventional structure of an n-channel-Si-MOSFET (a) and an embodiment according to the invention of the strained n-channel-Si-MOSFET with a cluster layer and, located above it, a strained Si-channel layer (b) with associated energy band edge patterns;

FIGS. 1c, d a p-channel-Si-MOSFET (c) with an associated energy band edge pattern and an n/p-channel-Si-MOSFET with a plurality of island layers (d);

FIGS. 2a, b an n-channel-Si-MOSFET with two island layers and a buried channel layer (a) and a plurality of island layers and a plurality of buried channel layers (b);

FIGS. 3a, b a Si-MOSFET with an island layer forming the channel region and an associated energy band edge pattern (a) and a buried island layer (b) forming the channel region;

FIGS. 4a, b different embodiments of modulation-doped p-channel-Si-MOSFETs with a Ge island layer forming the channel region;

FIG. 5 a modulation-doped n-channel-GaAs-MOSFET with an InGaAs island layer forming the channel region;

FIG. 6 a CMOS structure with an n-channel-Si-MOSFET and a p-channel-Ge-island MOSFET;

FIG. 7 a top plan view of a field-effect transistor according to the invention with a linear arrangement of island structures;

FIG. 8 a depiction of a process according to the invention for the production of the field-effect transistor according to FIG. 7.

FIGS. 1 through 6 depict in each case cross-sectional representations of MOSFET structures through the gate, the source and drain regions, and an island structure connecting the source and drain region.

Although the following description often mentions Ge islands for the sake of simplicity, the expression means in general semiconductor clusters with the material composition $Si_xGe_{1-x}$ ($0 \leq X < 1$).

FIG. 1a schematically depicts a typical conventional n-Si-MOSFET, which has been produced on a p-doped Si (001) wafer, and the associated position-dependent energy band edge pattern of the conduction band between two points A and B. On the $SiO_2$/Si interface, electrons are transported from source to drain, whereby the electron flow is controlled by the gate voltage. As a result of the confinement on the interface, a splitting of the Δ-valleys occurs in known fashion, which occurs, however, with this conventional structure only in the range of a few meV.

In contrast with this, FIG. 1b depicts an n-channel-Si-MOSFET with a strained channel region. Below the Si-channel region, there is a pseudomorphically strained Ge island. This island generates a local strain field in the Si-channel above the island. Since the intrinsic lattice constant of Ge is larger than that of Si, the Si is expanded in the growth plane above the island, a situation which is reflected in the opposing arrows. The strain reduces the symmetry of the Si crystal and cancels the 6-fold degeneracy of the Δ-valleys. The Δ(2)-valleys are lowered in the growth direction and the Δ(4)-valleys are raised in the growth plane. Compared to the conventional structure of FIG. 1a, splitting can be increased many times over. Upon transport of current through the transistor, the depressed Δ(2)-valleys are filled. Since the Δ(2)-valleys in the growth plane have an approximately 5-fold smaller effective mass than the Δ(4)-valleys, the charge carrier mobility can be drastically increased in this manner. The greater splitting also results in the fact that charge carrier scattering processes are reduced.

FIG. 7 depicts a transistor structure according to the invention schematically in a top plan view. The Ge island structures are arranged linearly along the gate width and connect the source and drain regions to each other. The gate width is discernibly clearly longer than the gate length. The gate lengths used nowadays in MOS technology are typically 100–200 nm, whereby it is to be anticipated that in the future an additional shortening will occur in accordance with Moore's Law.

So that a parallel arrangement of field-effect transistors is possible, the island structures must be arranged in a chain or in a line along the gate width. Consequently, for mass integration, the production of parallel island chains is extremely advantageous. It should be mentioned here already that, with the process according to the invention, islands arranged in chains also form under the source, drain and gate contacts. However, this has no effect on the function of the transistor components.

When, on an unstructured semiconductor substrate of the first semiconductor material, a second semiconductor material with a clearly different lattice constant is grown, a spontaneous and spatially random formation of island structures occurs—as already mentioned. In order to guide the island growth in a specific direction, the substrate can be prestructured. FIG. 8 schematically depicts a process for the production of linear Si—Ge island structures on a Si substrate. In this process, linear ditches or depressions $1a$, $1b$ are formed in a (001)-oriented Si substrate. On this prestructured substrate, an alternating sequence of Si layers and germanium-rich SiGe layers is then initially grown. For energy reasons, already with the deposition of the first layer, the formation of a strain field occurs in the region of the depressions $1a$, $1b$, which continues upward during the growth of additional layers. With an increasing number of layers, after the respective Si deposition, a continuing planarization of the structure is obtained. When finally in the last step a SiGe layer with an adequate amount of material and germanium concentration is grown, the formation of island structures along the lines provided by the prestructuring occurs. The distance between the linear structures should be within the range of the diffusion lengths of the atoms being added and distributed on the surface in the growth process. In the present case, the diffusion length is approximately 250 nm. It is completely possible that under optimum growth conditions, only a single Ge-rich SiGe layer suffices.

A first SiGe layer can also be initially grown on an unstructured Si substrate and then the SiGe layer can be structured in the above-described manner.

The coherent Ge islands typically have a diameter of approximately 10 to several 100 nm. These dimensions thus correspond very well to the gate lengths obtainable currently and in the near future.

It is thus possible to produce one or a plurality of island layers with chainlike island structures arranged one on top of another. In a known manner, source and drain regions can then be generated by diffusion or implantation into the transistor structure on two opposite end sections of the island structures, such that in each island layer the source and drain regions are connected to each other by the islands.

Since the Si material of the channel region strained by the strain field of the Ge islands also enables greater hole mobility, a p-channel transistor like that depicted in FIG. $1c$ with an associated position-dependent energy band edge pattern can be realized with the concept according to the invention. The capability of production according to the invention of p-channel transistors is of critical significance for the production according to the invention of components produced in CMOS technology (see FIG. 6).

It can be seen from the above description of a process according to the invention for the production of linear island structures that it is also possible to arrange self-organized island structures perfectly on top of each other since the strain fields once generated can continue in the growth direction indefinitely on top of each other and thus, with new growth of SiGe layers, result in the formation of growth islands with the same position dependency as in the underlying layers. It is thus possible to arrange self-organizing island structures perfectly on top of each other. Through this concept, the necessary strain fields can be massively reinforced and thus the Δ-splitting can be increased significantly. FIG. $1d$ depicts an embodiment according to this concept, wherein a plurality of island layers are arranged on top of each other in order to generate a reinforced strain field in the channel region above the uppermost island layer. The transistor can selectively be designed as an n- or p-channel transistor. The source and drain regions may—as depicted—but do not necessarily have to, extend to the uppermost island layer. In the present case, it is advantageous for them to be formed as flat doping regions.

It is also possible to generate one or a plurality of channel regions buried under the surface of the transistor. A variant with a buried Si channel region is depicted in FIG. $2a$. Here, in contrast to the embodiment according to FIG. $1b$, an additional Ge island layer is grown after growth of the Si channel layer. The channel region is thus embedded between two island layers, whereby a relatively large strain field is generated in the channel region. This structure can also be multiplied so to speak according to FIG. $2b$, in that a plurality of island layers are generated on top of each other and several or all of the Si layers located between them are used as channel regions, in that the source and drain regions are formed as far as the depth of the lowest island layer. Of course, the transistors depicted in FIGS. $2a$, $b$ may also be designed as p-channel transistors.

FIGS. $3a$, $b$ depict embodiments according to a second aspect of the present invention. In these embodiments, the channel region is formed by the island structures themselves, i.e., the source-drain current of the transistor flows through the islands. FIG. $3a$ depicts an exemplary embodiment in which the island layer is located on the surface of the transistor, whereas FIG. $3b$ depicts a buried island structure whereby yet another Si layer was grown on the island layer. The burying of the island structure has the advantage that an interface that has better characteristics than a Ge/SiO$_2$-interface is generated between the Ge island and Si material in the upward direction as well. The two structures depicted may be designed both as an n- and as a p-channel transistor. In the right hand part of the drawing of FIG. $3a$, a position-dependent energy band edge pattern of the valence band is depicted with respect to a p-channel transistor.

When, with certain material systems, no suitable gate oxide or other insulator is available, it is possible to use, as an additional embodiment according to the invention, a modulation-doped transistor structure known in the prior art. Such so-called MODFET structures are depicted in FIGS. $4a$, $b$ for the Si/Ge material system and in FIG. 5 for the GaAs/InGaAs material system.

FIGS. $4a$, $b$ depicts this concept with reference to a p-channel transistor wherein the channel is formed by Ge islands. In the embodiment according to FIG. $4a$, a highly doped p$^+$-doped Si layer is embedded above the channel region in the surrounding n-doped Si. In the inverted structure of FIG. $4b$, this layer is arranged below the channel region. In FIG. 5, a highly doped n$^+$-layer is embedded in the midst of surrounding p-doped GaAs above an island of n-doped InGaAs of a GaAs-n-channel field-effect transistor. Such MODFET structures may also be used on embodiments according to FIGS. 1 and 2, in which the channel region is formed by strained semiconductor material.

And finally, FIG. 6 depicts yet another complete CMOS structure made up of an n-channel transistor and a p-channel transistor in which the channel region of the n-channel transistor is formed by strained silicon above island structures (left part of drawing) and the channel region of the p-channel transistor is formed by Ge islands (right part of drawing). This structure may also be produced with stacked island layers.

In the production of field-effect transistors, both conventional and according to the invention, thermal oxidation is an important process step. Customarily, temperatures>700° C. are necessary for this. The epitaxial cluster layer must be able to withstand these temperatures without plastic relaxation. In initial annealing experiments, it has already been demonstrated that the Si/Ge islands may be heated to temperatures above 1000° C. without dislocations occurring. There was merely a Si—Ge material mixing, which did not, however, interfere with the production of the oxide.

Alternatively to the above-described process for production of a field-effect transistor according to the invention, it can also be produced in that first a layer structure of a conventional field-effect transistor is grown and then semiconductor clusters are generated at the appropriate places by diffusion or implantation. Such a process has, consequently, the following process steps:
Preparing a substrate made of a first semiconductor material;
Forming semiconductor clusters from a second semiconductor material by the addition of impurities, in particular by diffusion or implantation;
Forming source and drain regions in or above end sections of the semiconductor clusters;
Forming a gate electrode on the surface of the transistor above the semiconductor clusters.

The production steps of the semiconductor cluster and of the source/drain regions may in principle be performed in any order and possibly even self-adjustingly after performance of the production of the gate electrode. Preferably, the semiconductor clusters are generated by implantation of foreign atoms or foreign ions, since these offer greater positional resolution as well as the capability of generating the clusters even in relatively deep regions.

What is claimed is:

1. Field-effect transistor, with a semiconductor substrate made of a first semiconductor material, a cluster layer, in which a plurality of semiconductor clusters made of a second semiconductor material different from the first semiconductor material are arranged on the substrate and are at least partially surrounded by the first semiconductor material, wherein the crystal configuration of the semiconductor clusters is in an elastically or partially elastically relaxed state thereby causing a three-dimensional strain field in the surrounding first semiconductor material, source and drain regions which extend vertically at least to a channel region, whereby at least one part of the semiconductor cluster extends laterally between sections that lie below or within the source/drain regions, a channel region that is formed from the aforementioned part of the semiconductor cluster and/or from a layer of said first semiconductor material possibly deposited above said part of the semiconductor cluster, wherein the crystal configuration of the said layer is in a strained state caused by the three-dimensional strain field or fields of the at least partially surrounded and at least partially elastically relaxed clusters, and a gate electrode formed above the channel region.

2. Field-effect transistor according to claim 1, characterized in that
the first semiconductor material is silicon,
the second semiconductor material is $Si_xGe_{1-x}$ ($0 \leq X < 1$).

3. Field-effect transistor according to claim 1, characterized in that
the first semiconductor material is GaAs,
the second semiconductor material is InGaAs.

4. Field-effect transistor according to claim 1, characterized in that on the cluster layer, a layer of the first semiconductor material is formed, which layer has the sections forming the channel region made of a strained first semiconductor material, which extend from the source region to the drain region and which lie above said part of the semiconductor cluster.

5. Field-effect transistor according to claim 4, characterized in that an additional cluster layer is formed on the layer of the first semiconductor material, in which cluster layer a large number of semiconductor clusters are arranged on the layer of the first semiconductor material and are surrounded by the first semiconductor material.

6. Field-effect transistor according to claim 4, characterized in that an alternating sequence of additional cluster layers and layers of the first semiconductor material formed thereon is arranged on the layer of the first semiconductor material, whereby the cluster layers are formed in each case in that a plurality of semiconductor clusters is arranged on the underlying layer of the first semiconductor material.

7. Field-effect transistor according to claim 6, characterized in that the source and drain regions extend vertically to the uppermost layer of the first semiconductor material.

8. Field-effect transistor according to claim 6, characterized in that the source and drain regions extend vertically to a deeper lying, possibly to the lowest layer of the first semiconductor material.

9. Field-effect transistor according to claim 1, characterized in that the channel region is formed by semiconductor clusters that extend from the source region to the drain region.

10. Field-effect transistor according to claim 9, characterized in that the gate electrode is formed directly above the cluster layer.

11. Field-effect transistor according to claim 9, characterized in that a layer of the first semiconductor material is formed on the cluster layer such that the cluster layer is formed as a buried layer.

12. Field-effect transistor according to claim 1, characterized in that it is designed as a MODFET structure.

13. Field-effect transistor according to claim 1, characterized in that
the semiconductor clusters are arranged linearly in the at least one cluster layer.

14. Field-effect transistor according to claim 13, characterized in that
a plurality of cluster layers are stacked one on top of another and the lines of the semiconductor clusters are arranged on top of each other.

15. A CMOS semiconductor device comprising:
a p-type semiconductor substrate;
an NMOS transistor having:
NMOS transistor n-type doped source and drain zones provided in an NMOS transistor surface region of the p-type semiconductor substrate and extending to a depth from the NMOS transistor surface region,
an NMOS transistor gate electrode overlying the NMOS transistor surface region with an NMOS transistor gate dielectric layer therebetween,
an NMOS transistor n-type channel region disposed in the p-type semiconductor substrate under the NMOS transistor gate electrode and interposed between the *NMOS transistor n-type doped source and drain zones, and an NMOS cluster layer disposed in the p-type semiconductor substrate adjacent the NMOS transistor n-type channel region and interposed between the NMOS transistor n-type doped source and drain zones, the NMOS cluster layer being configured in an elastically or partially elastically relaxed state to generate a three-dimensional strain field in the adjacent NMOS transistor n-type channel region; and a PMOS transistor having:
PMOS transistor p-type doped source and drain zones provided in a PMOS transistor surface region of a n-type well disposed in the p-type semiconductor substrate, the PMOS transistor p-type doped source and drain zones extending to a depth from the PMOS transistor surface region,
a PMOS transistor gate electrode overlying the PMOS transistor surface region with a PMOS transistor gate dielectric layer therebetween, and
a PMOS transistor p-type channel region disposed in the n-type well under the PMOS transistor gate electrode and interposed between the PMOS transistor p-type doped source and drain zones, the PMOS transistor p-type channel region being formed by a PMOS transistor cluster layer disposed in the n-type well and interposed between the PMOS transistor p-type doped source and drain zones.

16. The CMOS transistor according to claim 15, wherein the p-type semiconductor substrate and the n-type well are silicon and the NMOS cluster layer and the PMOS cluster a layer are $Si_xGe_{1-x}$ ($0 \leq X < 1$).

17. The CMOS transistor according to claim 15, wherein the p-type semiconductor substrate and the n-type well are GaAs and the NMOS cluster layer and the PMOS cluster layer are InGaAs.

18. The CMOS transistor according to claim 15, further comprising an alternating sequence of one or more additional NMOS n-type channel regions and one or more respective adjacent NMOS cluster layers disposed in the substrate under the NMOS transistor gate electrode and interposed between the NMOS transistor n-type doped source and drain zones.

19. An NMOS transistor comprising:
a p-type semiconductor substrate;
NMOS transistor n-type doped source and drain zones provided in an NMOS transistor surface region of the p-type semiconductor substrate and extending to a depth from the NMOS transistor surface region;
an NMOS transistor gate electrode overlying the NMOS transistor surface region with an NMOS transistor gate dielectric layer therebetween;
an NMOS transistor n-type channel region disposed in the p-type semiconductor substrate under the NMOS transistor gate electrode and interposed between the NMOS transistor n-type doped source and drain zones; and
an NMOS cluster layer disposed in the p-type semiconductor substrate adjacent the NMOS transistor n-type channel region and interposed between the NMOS transistor n-type doped source and drain zones, the NMOS cluster layer being configured in an elastically or partially elastically relaxed state to generate a three-dimensional strain field in the adjacent NMOS transistor n-type channel region.

20. The NMOS transistor according to claim 19, wherein the p-type semiconductor substrate is silicon and the NMOS cluster layer is $Si_xGe_{1-x}$ ($0 \leq X < 1$).

21. The NMOS transistor according to claim 19, wherein the p-type semiconductor substrate is GaAs, and the NMOS cluster layer is InGaAs.

22. The NMOS transistor according to claim 19, further comprising an alternating sequence of one or more additional NMOS n-type channel regions and one or more respective adjacent NMOS cluster layers disposed in the p-type semiconductor substrate under the NMOS transistor gate electrode and interposed between the NMOS transistor n-type doped source and drain zones.

23. A PMOS transistor comprising:
an n-type semiconductor substrate;
PMOS transistor p-type doped source and drain zones provided in a PMOS transistor surface region of the n-type semiconductor substrate and extending co a depth from the PMOS transistor surface region;
a PMOS transistor gate electrode overlying the PMOS transistor surface region with a PMOS transistor gate dielectric layer therebetween;
a PMOS transistor p-type channel region disposed in the n-type semiconductor substrate under the PMOS transistor gate electrode and interposed between the PMOS transistor p-type doped source and drain zones; and
a PMOS cluster layer disposed in the n-type semiconductor substrate adjacent the PMOS transistor p-type channel region and interposed between the PMOS transistor p-type doped source and drain zones, the PMOS cluster layer being configured in an elastically or partially elastically relaxed state to generate a three-dimensional strain field in the adjacent PMOS transistor p-type channel region.

24. The PMOS transistor according to claim 23, wherein the n-type semiconductor substrate is silicon and the PMOS cluster layer is $Si_xGe_{1-x}$ ($0 < X \leq 1$).

25. The PMOS transistor according to claim 23, wherein the n-type semiconductor substrate is GaAs, and the PMOS cluster layer is InGaAs.

26. The PMOS transistor according to claim 23, further comprising an alternating sequence of one or more additional PMOS p-type channel regions and one or more respective adjacent PMOS cluster layers disposed in the n-type semiconductor substrate under the PMOS transistor gate electrode and interposed between the PMOS transistor p-type doped source and drain zones.

* * * * *